United States Patent [19]
Wu

[11] Patent Number: 6,005,810
[45] Date of Patent: Dec. 21, 1999

[54] BYTE-PROGRAMMABLE FLASH MEMORY HAVING COUNTERS AND SECONDARY STORAGE FOR DISTURB CONTROL DURING PROGRAM AND ERASE OPERATIONS

[75] Inventor: Koucheng Wu, San Jose, Calif.

[73] Assignees: Integrated Silicon Solution, Inc.; NexFlash Technologies, Inc., both of Santa Clara, Calif.

[21] Appl. No.: 09/131,566

[22] Filed: Aug. 10, 1998

[51] Int. Cl.[6] .................................................... G11C 16/04
[52] U.S. Cl. ................................ 365/185.33; 365/185.08; 365/185.28; 365/185.29
[58] Field of Search ........................ 365/185.33, 185.08, 365/185.28, 185.29

[56] References Cited

U.S. PATENT DOCUMENTS

| | | | |
|---|---|---|---|
| 5,485,595 | 1/1996 | Assar et al. | 711/103 |
| 5,491,657 | 2/1996 | Haddad et al. | 365/185.27 |
| 5,708,605 | 1/1998 | Sato | 365/185.29 |

*Primary Examiner*—David Nelms
*Assistant Examiner*—Hoai V. Ho
*Attorney, Agent, or Firm*—Coudert Brothers

[57] ABSTRACT

A byte-programmable/byte-erasable flash memory system having on-chip counters and secondary storage for word line and bit line disturbance control during program and erase operations. The counters count the numbers of program/erase cycles and compare them with empirically predetermined counter limits; when the program/erase count exceeds the counter limit, the data then carried in the system are temporarily transferred onto the secondary storage while the memory array is refreshed and the counters are reset. The lifetime of the resulting flash memory system is improved because of decreased erase and program stresses in the memory array.

11 Claims, 7 Drawing Sheets

BYTE-PROGRAMMABLE FLASH MEMORY HAVING COUNTERS AND SECONDARY STORAGE FOR DISTURB CONTROL DURING PROGRAM AND ERASE OPERATIONS

BACKGROUND OF THE INVENTION

1. Field of the Invention

This invention relates to flash memory arrays in general, and more particularly to a novel byte-programmable and byte-erasable flash memory array having on-chip counter means and secondary storage means for the control of word line and bit line disturbances during program and erase operations.

2. Description of the Prior Art

Semiconductor memories are considered one of the crucial microelectronics components for mainframe computers, personal computers, telecommunication equipment, automotive and consumer electronics, commercial and military avionics systems, and so on. Semiconductor memory devices include both volatile random access memories (RAMs) and nonvolatile memory devices (NVMs). The data stored in an NVM are not lost when the power supply is removed. Depending on the design and the fabrication technology, nonvolatile memory data storage mode may be either permanent or re-programmable. Various categories of NVMs have been developed in the art, including mask read-only memory (mask ROM), programmable read-only memory (PROM), erasable programmable read-only memory (EPROM), electrically alterable read-only memory (EAROM), electrically erasable programmable read-only memory (EEPROM or $E^2$PROM), nonvolatile static random access memory (NVRAM), and the flash memory.

One of the most important erasable-programmable NVMs is the flash memory device, in which the contents of all the memory cells in an array or in a section or block of an array can be erased simultaneously through the use of an electrical erase signal. A flash memory cell can be based on either EPROM or $E^2$PROM technology, the latter typically requiring a select transistor and a floating gate transistor per memory cell. The choice between the flash $E^2$PROM memory and the flash EPROM memory thus depends on the tradeoffs between the higher density of the EPROM technology and the in-circuit programming flexibility of the $E^2$PROM technology. Most conventional flash memories have been based on EPROM in view of its compactness, speed and relatively low cost.

The structure of a flash memory cell is essentially the same as that of an EPROM or $E^2$PROM memory cell. Thus, a floating gate transistor having a floating gate, typically located between a control gate and a substrate, is used to store electrical charges that represent a data bit.

FIG. 1 is a cross-sectional view of a conventional stacked-gate flash EPROM memory cell transistor 10 as fabricated in a flash EPROM array. Typically, the substrate 12 is a monocrystalline silicon wafer having a first conductivity type dopant, e.g., the p-type. The substrate 12 has a source region 14 and a drain region 16, both doped with a second conductivity type dopant, e.g., the n-type. A channel zone 18 is defined by the near-surface area of the substrate 12 between the source 14 and the drain 16.

The flash memory cell shown in FIG. 1 has two gates: the floating gate 20 and the control gate 22. The floating gate 20 and the control gate 22 are usually made of the same material, i.e., polysilicon. Layers of dielectric materials 24 are deposited between the substrate 12 and the floating gate 20 (e.g., silicon dioxide) and between the floating gate 20 and the control gate 22 (e.g., an oxide-nitride-oxide interpoly dielectric). The dielectric (oxide) layer between the substrate 12 and the floating gate 20 is the gate oxide layer 26. As shown in FIG. 1, the floating gate 20 in the flash memory cell 10 typically overlaps with the edges of the source region 14 and the drain region 16.

When the floating gate 20 of a flash memory cell 10 carries no charge, the floating gate 20 has no influence on the electric field generated by the active control gate 22 in the channel zone 18. However, once the floating gate 20 is charged with electrons, the charge on the floating gate 20 will generate in the channel zone 18 an electrical field opposite to the field generated by the active control gate 22, thus raising the threshold voltage ($V_t$) of the flash memory cell, i.e., the control-gate-to-source potential difference required to turn on the cell. Following the convention used in the EPROM technology, the memory cell charging operation is typically referred to as the "program" operation, while the discharging operation is typically referred to as the "erase" operation.

Typically, to program the flash EPROM cell transistor 10, a control gate voltage of +9 to +12 V is applied to the control gate 22, a typical drain voltage of +5 to +6 V is applied to the drain 16, and the source 14 is grounded. These conditions create an electric field that causes electrons to flow from the source region 14 to the drain region 16. In addition, an electric field is created by the large positive voltage at the control gate 22. Some of the electrons moving from the source 14 to the drain 16 will have sufficient energy (i.e., "hot electrons") to pass through the gate oxide 26 and collect on the floating gate 20 to represent a data bit. This process is the so-called channel hot carrier injection ("HCI") programming. The amount of charge transferred to the floating gate 20 is very time-dependent. A typical program operation will require the above voltages be present for a relatively long duration, e.g., 10 $\mu$sec. As a comparison, a typical read operation takes less than 100 nsec.

In a typical "read" operation of a flash memory cell, the drain region 16 is connected to a small positive voltage of +1 to +2 V while the source region 14 is grounded. A positive voltage, e.g., +5 V, is applied to the control gate 22. As described above, the electrical charges present on the floating gate 20 will alter the threshold voltage of the cell. A cell which is erased or not programmed has a relatively low threshold voltage of about +2 V (i.e., low $V_t$ state), while a programmed cell has a relatively high threshold voltage of +5 to +6 V (i.e., high $V_t$ state). Thus, if a memory cell 10 has been programmed, the gate-to-source voltage of +5 V will be close to the programmed threshold voltage, so that little current will flow. This absence of cell current indicates that the cell is in a programmed state. By common convention, a memory cell in the programmed state has a logic state of "0". If, on the other hand, the memory cell 10 is in an erased or unprogrammed state, the control-gate-to-source voltage of +5 V will exceed the threshold voltage of +2 V and cause the cell to conduct a current. The presence of a cell current indicates that the cell is in an erased state. Again by common convention, a memory cell in the erased state has a logic state of "1". During a read operation, the cell current is converted to a voltage, which is then compared with a reference voltage by a sense amplifier (not shown in FIG. 1). The output of the sense amplifier will indicate whether the cell is programmed (a logic "0") or erased (a logic "1").

A flash memory cell 10 can be erased in a number of ways. For example, in the so-called negative-gate source erase, a control gate voltage of approximately −10 V and a source voltage of approximately +5 V are respectively applied, while the drain 16 is allowed to float. These erase voltages enable electrons to be driven from the floating gate 20 to the source 14, typically via the Fowler-Nordheim tunneling mechanism. Source erase allows a "page-erase" that can erase typically 512 or 128 bytes at a time. Another example of the source erase operation involves applying a large positive voltage (e.g., +10 V) to the source region 14, allowing the drain 16 to float, and connecting the control gate 22 to ground. Still another example of the erase operation is the channel erase, in which charges on the floating gate 20 are caused to move to the substrate 10 rather than to the source 14, again through the Fowler-Nordheim tunneling mechanism. To implement effective source erase or negative-gate source erase, a double-diffused implant (DDI) (not shown in FIG. 1) is generally introduced into the source regions 14.

In a conventional flash memory array, each time a memory cell (representing a bit) is re-programmed, it must first be in the erased state having a logic state of "1". This is because cell programming can only change the threshold voltage from low to high, corresponding to a change from a logic "1" to a logic "0". Thus, to program a selected memory cell in a conventional flash memory, the word line (described below) to which the control gate of the cell is connected and the bit line (also described below) to which the drain of the cell is connected must first be selected, and the entire sector or even the whole array containing the selected cell must first be erased before it can be programmed. Consequently, programming and erasing conventional flash memories are often time-consuming tasks that require a specialized command protocols comprising command sequences of read, program, and erase for writing data to selected memory locations.

A flash memory array contains many individual memory cells orthogonally interconnected along word lines ("WL's") and bit lines ("BL's"). A typical flash memory array configuration is the so-called common source NOR-type NVM array. A layout representation of a portion of a common source NOR-type flash memory array 30 is shown in FIG. 2. In the NOR array 30, n+ diffused Vss metal common source lines 32 are placed every 16 to 64 metal bit lines 34 in the array 30 to provide connections 36 to n+ source buses 38. The Vss common source lines 32 and bit lines 34 are parallel to each other. Source buses 38, also essentially parallel to each other, are in addition essentially parallel to the polysilicon word lines 40. Each of the metal bit lines 34 provides connections 42 to the individual drain areas 44. Furthermore, as discussed above, implanted wells are typically used to provide isolated regions in the substrate, e.g., a p-type well or a double (p/n) well (not shown in FIG. 2).

Ideally, a flash memory should last forever. However, whenever an erase is performed on a flash memory cell, the transistor is stressed; if the transistor is then re-programmed, it is stressed once again. In an conventional flash memory erase operation, all the transistors in the page, sector or even entire array are stressed. Repeated stress inevitably reduces the life of the memory array over time. Because the sector/array erase is time-consuming, computers or electronic devices containing a conventional flash memory often encounter undue delays in changing the information in the flash memory and delays in regaining access to the flash memory. Therefore, it is highly desirable to develop a flash memory array that can be erased and programmed in a selected number of bits, e.g., bytes.

A flash memory should ideally maintain a programmed state indefinitely if such is desired. In reality, however, the size of the individual memory cells is constantly being reduced in order to increase the storage capacity of the semiconductor memory. This reduction in cell size has been accompanied by a decrease in the data retention of the cells, owing in a large part to the increased tendency to disturb the programmed state of the cells during various memory operations. The ability of a flash memory to retain data over a long time period is mainly affected by three types of disturbances, including "read disturb," "word line disturb," and "bit line disturb."

Read disturb occurs when a memory cell 10 of FIG. 1 becomes slightly programmed (i.e., its floating gate 20 is slightly charged) by way of the hot electron injection during a read operation. Thus, an electric field is created between the source region 14 and the drain region 16 due to the positive voltage (+1 to +2 V) applied to the drain region 16. This electric field causes a very small percentage of the electrons traveling between the drain and source regions to obtain sufficient energy to be drawn up to the floating gate 20 by the positive voltage of the control gate 22. This is true even though the time required to perform a read operation is much less than that required to perform a conventional program operation. Because the strength of the aforesaid electric field between the drain and the source is inversely proportional to the length of the channel zone 18, the read disturb phenomenon becomes more pronounced as cell geometries become smaller.

When a large positive voltage is applied to the control gate of a memory cell, with that control gate being connected to a word line of the array, word line disturb take places at the unselected cells on the same word line. For example, if one word line has 1024 cells, there are as many as 1016 unselected cells on the same word line during a byte-erase or program operation. These unselected cells on the same word line will experience the high-voltage stress or "WL disturb" during the erase or program operation. Compared to read line disturb, WL disturb is much more pronounced because of the relatively high voltage used in a program or erase operation. Similarly, bit line disturb takes place at the unselected cells on a bit line as one or more of the cells of the same bit line are selected for program or erase. For example, if one bit line has 64 cells and one bit on the same bit line is selected for program or erase, the other 63 unselected cells on the same bit line will experience the high voltage stress or "BL disturb" during the program or erase operation. Generally, the higher the program or erase voltage is and the smaller the memory cells become, the more aggravated is the problem of disturbance to adjacent cells on the same word line or the same bit line. It is thus highly desirable to develop a byte- or bit-programmable flash memory having advanced disturb control features.

SUMMARY OF THE INVENTION

It is therefore an object of the present invention is to provide a novel flash memory with disturb control which overcomes various problems associated with the prior art.

It is another object of the present invention to provide a flash memory the cells of which can be programmed and erased in bytes or multiple bits.

It is yet another object of the present invention to provide a relatively low-cost, easy-to-fabricate flash memory.

It is a further object of the present invention to provide a flexible flash memory that allows the option of writing either a "1" or a "0" to a bit instead of constantly having to first program the bit to "0".

Another object of the present invention is to provide an effective flash memory that provides high-speed programming and erase while avoiding unnecessary programming and erase of the unselected cells.

Yet another object of the present invention is to provide a flash memory that has improved endurance and lifetime because of reduced stress on the unselected cells during the erase and program operations of only the selected cells.

Briefly, according to one aspect of the present invention, a novel flash memory system comprises a counter on the chip to record the number of program/erase operations occurring in the system and to reduce the bit line and word line disturbances.

In a specific embodiment of the present invention, the counter of the aforementioned flash memory system contains a pre-defined value and counts the number of program/erase cycles, such that when the count exceeds the pre-defined value, the data existing on the system at that time are temporarily transferred onto to a secondary DRAM or SRAM storage device during the program/erase operation of the selected cells of the flash memory.

According to another aspect of the present invention, a novel flash memory system for programming and erasing in bytes comprises: a memory array including a plurality of flash memory cells sharing in common word lines and bit lines; programming means for selecting a word line and a bit line of flash memory cells by applying positive voltages to the control gate and the drain of a selected programming transistor while grounding the source of the same transistor; erasing means for selecting a word line and a bit line of flash memory cells by applying a negative voltage to the control gate and a positive voltage to the drain of a selected erasing transistor while allowing the source of the same transistor to float; reading means for selecting a word line and a bit line of flash memory cells by applying positive voltages to the control gate and the drain of a memory cell while grounding the source of the same memory cell; and counter means having a pre-determined number and being coupled to the programming means and the erasing means, for recording the numbers of program and erase cycles occurring in the memory array. In this embodiment of the present invention, the program operation is performed by hot electron programming of the program transistor, while the erase operation is performed by Fowler-Nordheim tunneling of the erase transistor.

In another specific embodiment of the present invention, the aforesaid specific embodiment of flash memory further comprises an internal (on-chip) or external (off-chip) secondary storage means coupled to the counter means, for temporarily storing the data transferred from the memory during the program or erase operations of the selected memory cells of the memory array. This external storage means may be a DRAM, SRAM, hard disk or another storage device.

In yet another specific embodiment of the present invention, the counter means of the above specific embodiment includes a word line disturb counter and a bit line disturb counter.

In still another specific embodiment of the present invention, a flash memory system for programming and erasing in bytes comprises: a flash memory array, coupled to an X-decoder, for inputting information as to the selected word line; a Y-gate/sense amplifier, coupled to the memory array, for inputting and outputting information as to the selected bit line; an X-address buffer, coupled to the X-decoder, for temporarily storing the input information received from the plurality of address lines; a counter, coupled to the X-decoder, for reading the number of program and erase cycles performed by the memory array; a refresh controller, coupled to the counter, for transmitting the data to a secondary memory storage device; an input/output buffer for storing information to be inputted or outputted; and a Y-decoder, coupled to the Y-gate/sense amplifier, for selecting which information to output to the input/output buffer.

According to a further aspect of the present invention, a new method for programming and erasing a flash memory in bytes comprises the steps of: providing a memory cell array that shares common word lines and bit lines; applying positive voltages to the control gate and to the drain of a selected memory cell while grounding its source for programming; applying a negative voltage to the control gate of a selected memory cell and a positive voltage to the drain of the other transistor, while floating the source for erasing a selected memory cells; counting the number of program and erase cycles occurring in the flash memory word lines and bit lines; transferring data stored on the flash memory to a secondary storage means when the number of program and erase cycles exceeds a pre-determined value; and restoring the data from the secondary storage means to the flash memory.

An advantage of the present invention is that power consumption of a flash memory is reduced because by it uses power only when a byte-erase or byte-program is required.

Another advantage of the present invention is that it provides a flash memory that can survive over a million program/erase cycles due to decreases in erase and program stresses on the unselected memory cells.

A further advantage of the present invention is that it provides an efficient and long-lasting flash memory that can be refreshed periodically.

These and other objects, features and advantages of the present invention will become apparent to those skilled in the art after reading the following detailed description of the preferred embodiments which are illustrated in the several figures of the attached drawings.

IN THE DRAWINGS

DETAILED DESCRIPTION OF THE PREFERRED EMBODIMENTS

Figure 3:
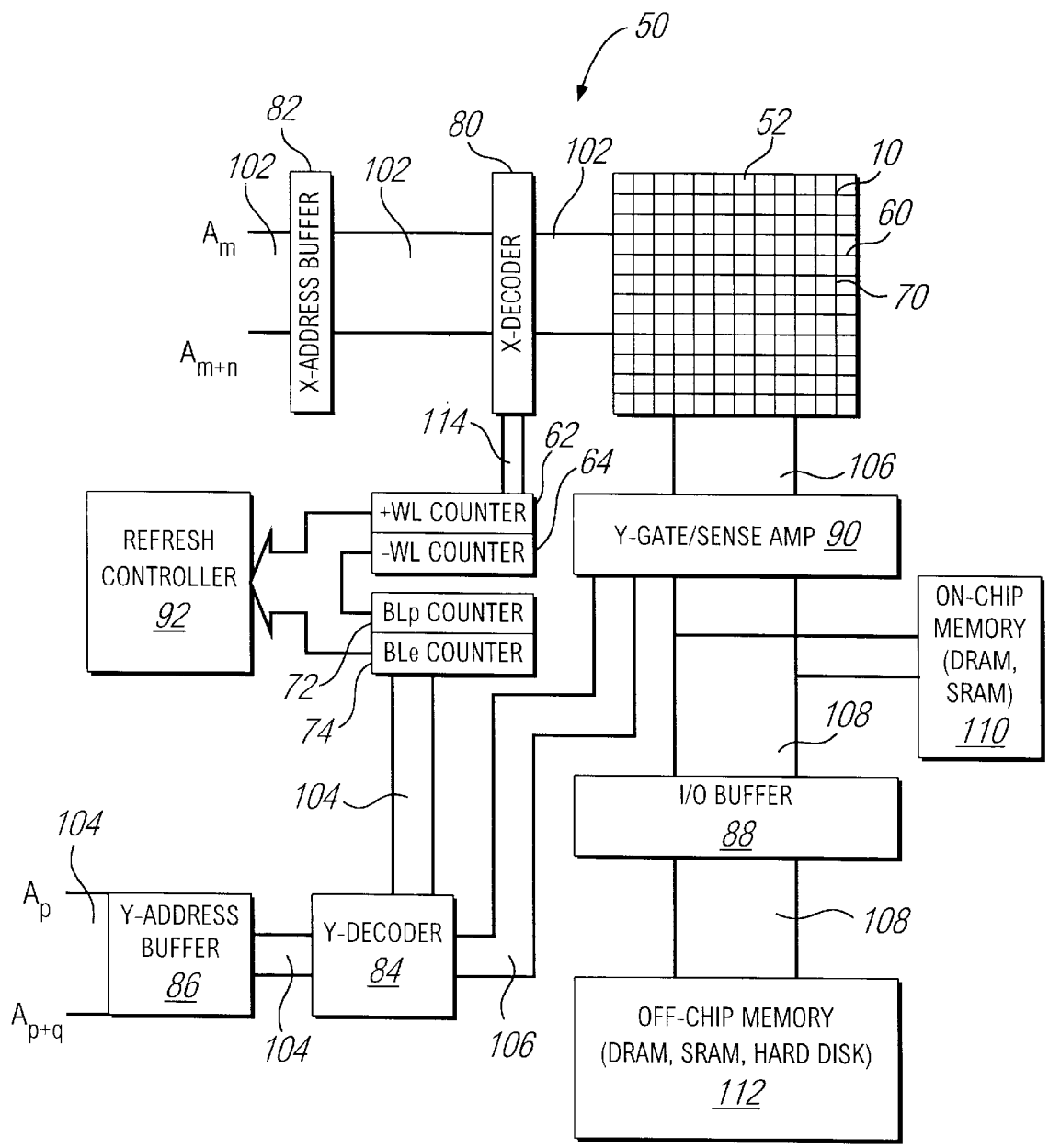
FIG. 3 is a block diagram of the byte-programmable/erasable flash memory having novel disturb control features according to the present invention.
Figure 4:
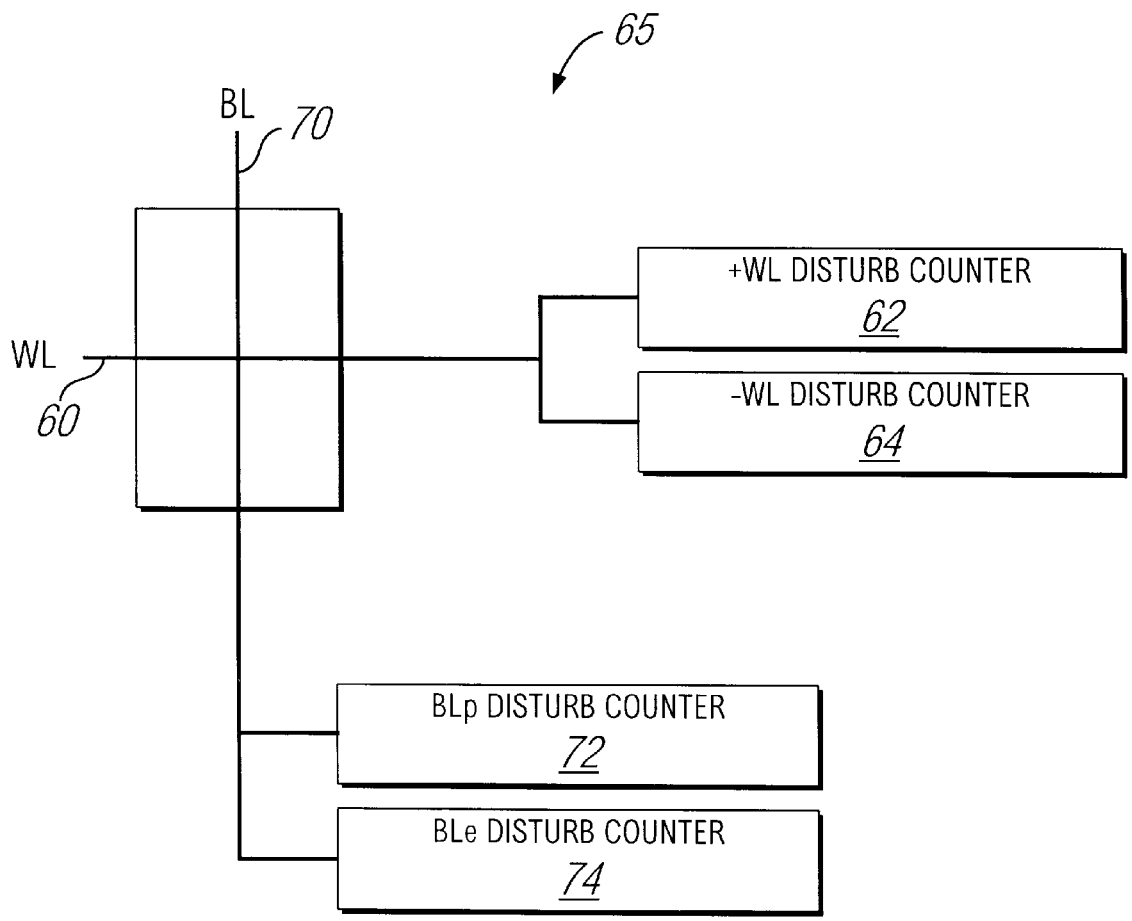
FIG. 4 is schematic representation of a disturb counter assembly of the present invention.
Figure 5:
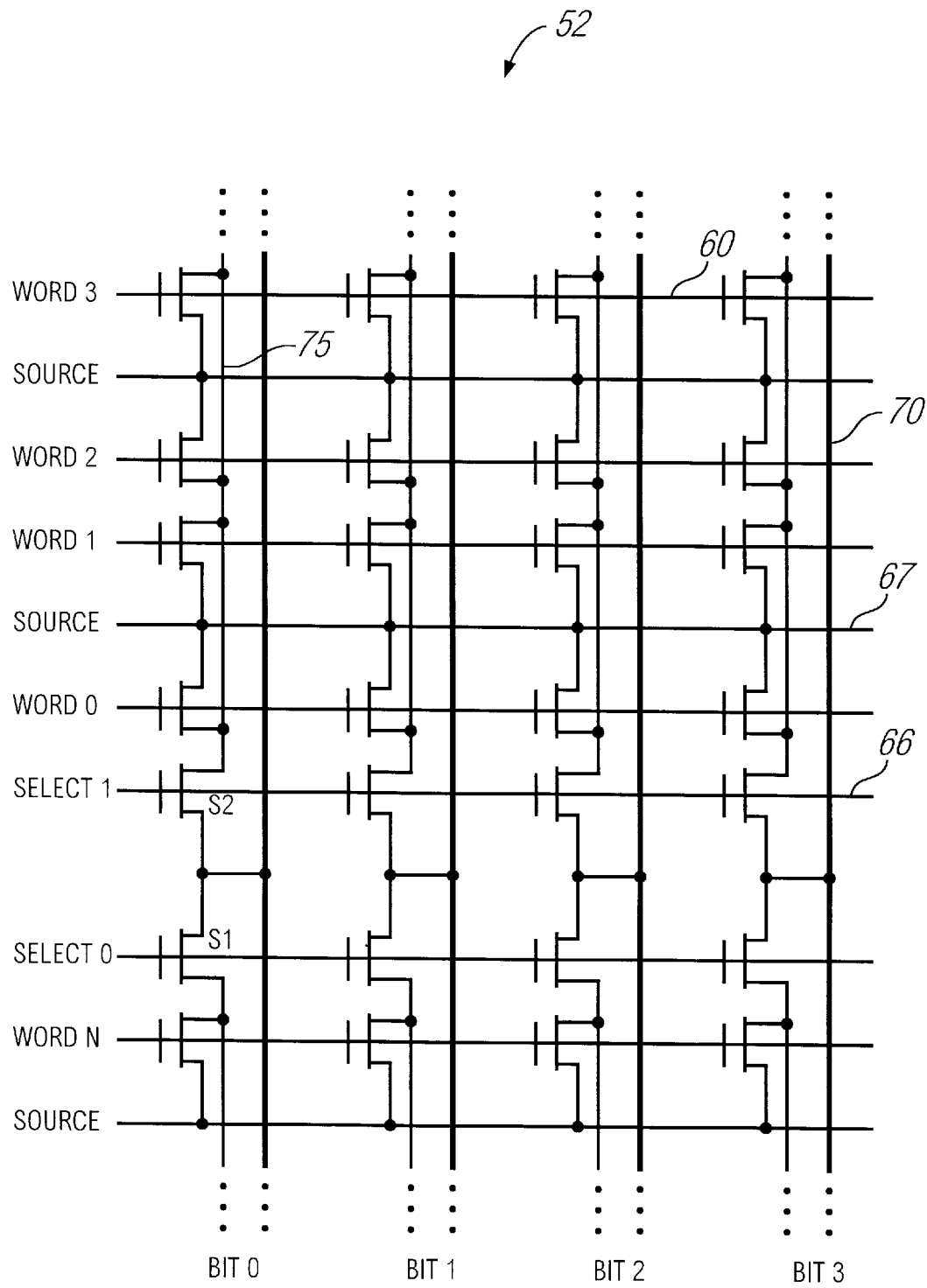
FIG. 5 is a schematic representation of an array architecture of a flash memory of the present invention.

While the present invention may be embodied in many forms, details of several preferred embodiments are schematically shown in FIGS. 3 through 5, with the understanding that the present disclosure is not intended to limit the invention to the embodiments illustrated. Thus, various specific configurations, voltages and memory arrays are introduced to aid in the understanding of the present invention, and various changes and modifications can be made while remaining within the scope of the claims.

According to one aspect of the present invention, the flash memory cell of the present invention allows a programmer to change the threshold voltage either from low to high (1 to 0) or from high to low (0 to 1) without having to first erase the entire sector or chip. Accordingly, the flash memory cell of the present invention operates in a fashion similar to a SRAM or DRAM memory, where a programmer can write 1 or 0 to a bit, except that the flash memory of the present invention is a nonvolatile memory (NVM) device.

In a specific embodiment of the present invention as shown in FIG. 3, a flash memory system 50 comprises a flash memory array 52 including a plurality of flash memory cells 10 interconnected via a plurality of word lines 60 and bit lines 70, an X decoder 80, a Y decoder 84, an X address buffer 82, a Y address buffer 86, an input/output (I/O) buffer 88, a Y-gate/sense amplifier 90, a positive word line (+WL) disturb counter 62 and a negative word line (−WL) disturb counter 64 for every word line 60, a bit line program (BLp) disturb counter 72 and a bit line erase (BLe) disturb counter 74 for every bit line 70, and a refresh controller 92. The +WL, −WL, BLp and BLe counters together form a disturb counter assembly 65 (see FIG. 4).

As shown above in FIG. 1, each of the flash memory cell transistors 10 in the flash memory system 50 comprises a floating gate 20, a control gate 22, a source 14 and a drain 16. The memory cell of the present invention can be made very small; the length of the channel zone 18 shown in FIG. 1 ("channel length") may range from 1.0 μm to 0.1 μm.

Figure 2:
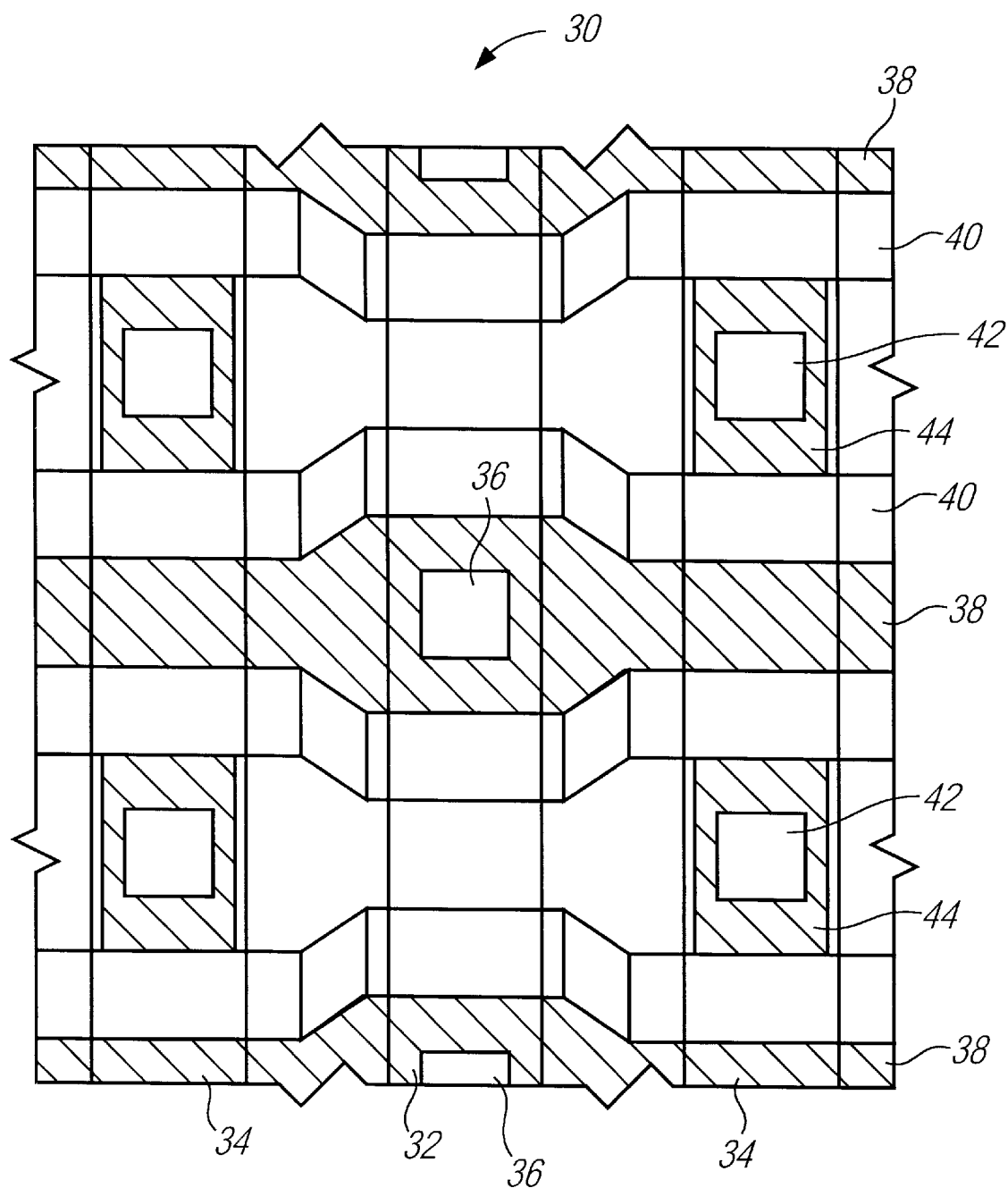
FIG. 2 is a layout representation of a prior-art common-source NOR-type flash memory array.

The control gate of a memory cell 10 is connected to a word line 60 of the memory array 52, while the drain 16 of the same memory cell 10 is connected to a bit line 70 of the memory array 52 (shown in FIG. 3). The source 14 is typically connected to a common source line (e.g., one of the common source lines 32 shown in FIG. 2). A p-well may be made part of the p-substrate 12. The source 14 and the p-well are typically grounded.

Figure 1:
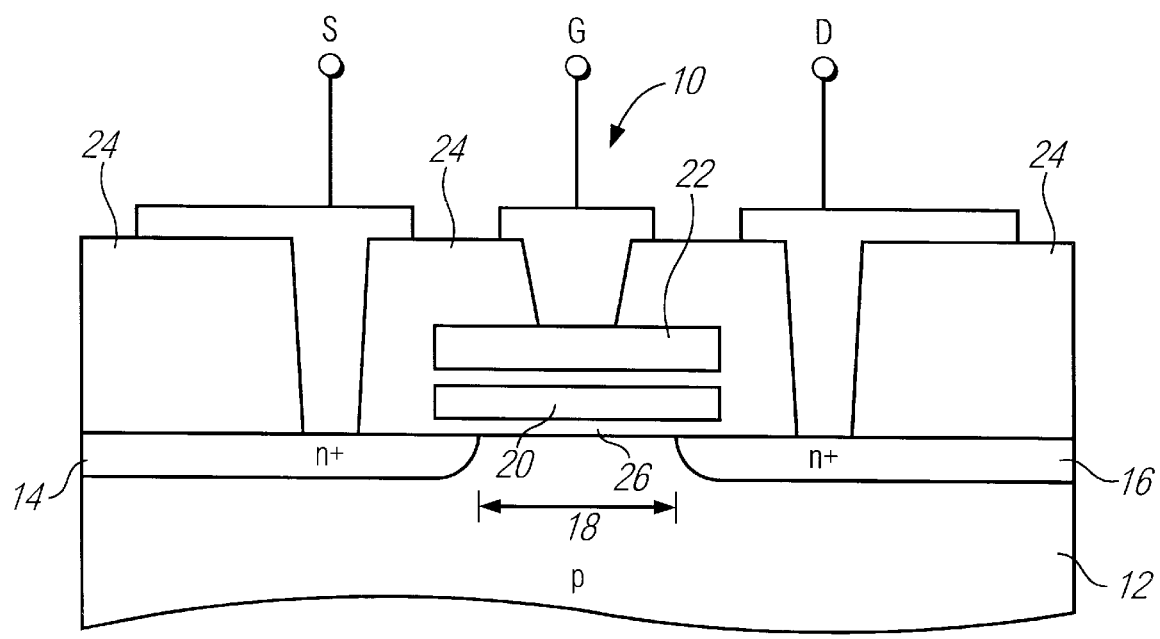
FIG. 1 is a cross-sectional representation of a prior-art flash memory cell.

The source region 14 and the drain region 16 of the programming transistor 10 are highly N-doped regions, which are indicated in FIG. 1 by the "n+" designation in these regions. The preferred type of programming performed on the transistor 10 is hot-electron programming. The preferred transistor voltages that are applied for optimum hot-electron programming is +12 volts to the control gate 22 (i.e., $V_G$=+12 V) and 6 volts to the drain 16 (i.e., $V_D$=+6 V). However, alternative programming voltages may be employed as shown in Table 1 below.

It is highly desirable to use a relative low drain voltage during hot-electron programming of a NVM cell, preferably a voltage on the order of less than five volts depending on the specification for programming time. The use of a lower drain voltage means a smaller bit line pump and fewer bit line and word line disturbances, but requires a longer programming time.

The flash memory cells of the present invention are byte-programmable because the drain 16 and the control gate 22 of the transistor 10 are controlled by the corresponding bit line and word line, respectively. The source 14 of the transistor 10 is common to all the flash memory cells in a block or sector. Thus, a bit is selected by designating a word line number and a bit line number in the block. Once a bit is selected, the corresponding cell is programmed by applying positive standard voltages to the control gate 22 and the drain 16 while grounding the source 14 and the p-well. In response to the relative high voltage applied to the control gate 22, hot electrons cross over the tunnel oxide 26 and gather on the floating gate 20.

The flash memory transistors 10 of the present invention may typically be erased by the method of negative gate drain erase (NGDE). The preferred transistor voltages for the NGDE method are: a negative voltage of −10 V applied to the control gate 22 (i.e., $V_G$=−10 V) and a positive voltage of +4 V applied to the drain 16 (i.e., $V_D$=+4 V). However, alternative erase voltages may be employed as shown in Table 1 below.

To erase a cell, it is preferably to rely on the Fowler-Nordheim tunneling. Thus, during an erase operation, electrons stored in the floating gate 20 flow to the drain region 16 by the Fowler-Nordheim tunneling mechanism and are discharged through the drain region to the outside of the memory transistor. In particular, by applying a negative gate voltage to the control gate 22 and a positive drain voltage to the drain 16 of the transistor 10, while allowing the source 14 to float and the p-well to be grounded, a selected cell can be erased. Thus, the bit to be erased (from "0" to "1") is selected by selecting the corresponding word line and bit line of the cell representing that bit.

To read the status of the selected cells of a flash memory array of the present invention, the source region 14 is grounded, a positive voltage, e.g., +5 V, is applied to the control gate 22, and another positive voltage, e.g., +1.2 V, is applied to the drain 16. Again the cells are selected by selecting the corresponding word lines and bit lines.

As shown in FIG. 3, the flash memory system 50 includes a memory array 52. The memory array 52 receives address inputs from the X-decoder 80, which is coupled to the X-address buffer 82. Information for activating the necessary word line for programming or erase operations data is inputted from the address bus 102 and outputted from the address bus 103. In a preferred embodiment of the present invention, there are a plurality of address lines in the address bus 102, and the X-address buffer has a plurality of pin connections $A_m$ to $A_{m+n}$ where n is typically 16. The function of the X-decoder 80 is to decode the plurality of inputted address lines $A_m$ to $A_{m+n}$ and select one of the word lines 60 in the array 52. In a program operation, the X-decoder 80 functions to apply +12 V to the selected word line 60 in the array 52. In an erase (by NGDE) operation, the X-decoder 80 functions to apply −10 V to the selected word line 60 in the array 52.

Similarly, the memory array 52 is coupled to the address bus 104 for receiving address inputs first into the Y-address buffer 86 and then into the Y-decoder 84. Such address data are also transmitted through the Y-gate/sense amplifier 90 and the transmission lines 106 to activate the necessary bit lines 70 of the flash memory array 52. The main function of the X-address buffer 82 and the Y-address buffer 86 is thus to temporarily hold the data transmitted from the address buses 102, 104, respectively.

In a preferred embodiment of the present invention, there are a plurality of address lines in the address bus 104, and the Y-address buffer 86 has a plurality of pin connections $A_p$ to $A_{p+q}$, where q is typically 8. The flash memory array 52 also receives data from, and output data to, the input/output (I/O) buffer 88 via the input/output (I/O) data bus 108, which also includes a plurality of address lines.

The Y-gate/sense amplifier 90 is used for carrying out read operations and other memory verification operations. The input/output (I/O) points (not shown) of the I/O Buffer 88 indicate the states of the multiple cells being read. The Y-gate/sense amplifier 90 is coupled to the Y-decoder 84 through transmission lines 106. In one preferred embodiment of the present invention, there are sixteen transmission lines 106.

FIG. 3 also depicts another aspect of the present invention, i.e., the use of an internal (on-chip) or external (off-chip) secondary memory device for the periodical refreshing of the content of the memory array 52. An on-chip memory device 110, such as a DRAM or SRAM, may be connected to the memory array 52. Alternatively or simultaneously, an off-chip memory device 112, such as a DRAM, SRAM or hard disk, may be connected to the memory array 52.

In an erase (by NGDE) operation, the Y-decoder 84 functions to apply +4 V to a selected bit line 70 in the array 52. In a program operation, the Y-decoder 84 functions to apply +6 V to those cells connected to the eight selected bit lines 70. The remaining, unselected bit lines are grounded.

The memory array 52 is connected to the X-decoder 80 via the data bus 102. The X-decoder has two more sets of connections: one set of connections linking it to the X-address buffer 82 and the other set of connections linking it to the +WL counter 62 and −WL counter 64. The disturb counters 62 and 64 are connected to the refresh controller 92. Additionally, the memory array 52 is connected, via the Y-gate/sense amplifier 90, to the Y-decoder 84 via the data bus 106. The Y-decoder has two more sets of connections: one set of connections linking it to the Y-address buffer 86 and the other set of connections linking it to the BLp counter 72 and BLe counter 74. The disturb counters 72 and 74 are also connected to the refresh controller 92.

As discussed above, the flash memory of the present invention can be programmed or erased in bytes. To alter the content of a byte, the byte is first selected and the content of the byte is read out. If any bit of the byte needs to be changed from "1" (low $V_t$ state) to "0" (high $V_t$ state), a byte-program operation is executed. Thus, a high positive voltage (e.g., +11 V) is applied to the word line while a positive voltage (e.g., +5 V) is applied to the selected bit lines (i.e., only the "1"→"0" bits). The selected bits are programmed by the HCI mechanism. Conversely, if any bit of the byte needs to be changed from "0" (high $V_t$ state) to "1" (low $V_t$ state), a byte-erase operation is executed. The preferred erase method of the present invention is NGDE, which allows as small as a single bit to be erased at a time. Thus, a large negative voltage (e.g., −10 V) is applied to the word line, while a positive voltage (e.g., +4 V) is applied to the selected bit lines (i.e., only the "0"→"1" bits). The selected bits are erased by the Fowler-Nordheim tunneling mechanism. An example is given below:

EXAMPLE

When one wishes to program a desired byte having eight bits on the word line, the steps are as follows:

| Bit | #0 | #1 | #2 | #3 | #4 | #5 | #6 | #7 |
| --- | --- | --- | --- | --- | --- | --- | --- | --- |
| Old Byte | 0 | 0 | 1 | 1 | 1 | 1 | 0 | 0 |
| New Byte | 1 | 0 | 0 | 1 | 1 | 0 | 0 | 1 |

Step 1: Read the content of the byte. Bits 2 and 5 need to be changed from "1" to "0". Bits 0 and 7 need to be changed from "0" to "1". Bits 1, 3, 4 and 6 do not need to be changed.

Step 2: Program bits 2 and 5 to high $V_t$. +WL counter advances by one, and BLp counter advances by one.

Step 3: Erase bits 0 and 7 to low $V_t$. −WL counter advances by one, and BLe counter advances by one.

Step 4: If any counter exceeds the limit, refresh the memory array by loading all the data on the memory array to the internal or external storage device (see detailed discussion below).

As shown in FIG. 4, the disturb counter assembly 65 is connected to a word line 60 and a bit line 70. The disturb counter assembly 65 comprises a +WL disturb counter 62, a −WL disturb counter 64, a BLp disturb counter 72, and a BLe disturb counter 74.

The disturb counter assembly 65 in FIG. 4 functions to record the numbers of program operations and erase operations performed by the memory array 52. When any of the counters (the +WL counter 62, the −WL counter 64, the BLp counter 72, and the BLe counter 74) reaches its pre-determined limit, the refresh cycle will be activated. This refresh cycle typically contains the following steps (see also FIG. 3):

Step 1: Transfer all the data from the flash memory array 52 to the secondary memory (110 and/or 112), and reset all counters. The following steps 2 to 4 are then executed on every byte.

Step 2: Read out the content of one byte from the secondary memory device, e.g., 10011001.

Step 3: Do program verification on the byte to make sure the content of bits #1, #2, #5 and #6 are "0". If the verification fails, re-program the failure bit to high $V_t$ state. +WL disturb counter and the selected BLp disturb counters are each advanced by one.

Repeat this Step 3 until the program verification is passed on the entire byte.

Step 4: Do erase verification on the byte to make sure the content of bits #0, #3, #4 and #7 are "1". If the verification fails, re-erase the failure bit to low $V_t$ state. −WL disturb counter and the selected BLe disturb counters are each advanced by one. Repeat this Step 4 until the erase verification is passed on the entire byte.

Step 5: The "verified" data is reloaded into the memory array.

The program verification (commonly known as "program verify") is a common practice known to those skilled in the art. Thus, a byte is checked by the program verify after each program cycle. If the byte fails the "program verify," another program cycle on the byte is executed, until the "program verify" is passed or the program counter (typically having a pre-determined number of 64, 128, 256 or 1024) is reached. The bias condition used in "program verify" (e.g., $V_G$=+6 V and $V_D$=+1.2 V) is similar to that used in a read operation (e.g., $V_G$=+5 V and $V_D$=+1.2 V), except that $V_G$ in "program verify" is higher to ensure, with a comfortable margin, that the programmed bits are in the high $V_t$ state.

The erase verification (commonly known as "erase verify") is also a common practice known to those skilled in the art. Thus, the flash memory is checked by the erase verify after each erase cycle. The number of bits selected for "erase verify" is highly dependent on the array architecture design. It can vary from one byte to an entire bit line. In a preferred embodiment of the present invention, one byte is selected for "erase verify." If the selected byte fails the "erase verify," another erase cycle on the byte is executed, until the "erase verify" is passed or the program counter (typically having a pre-determined number of 64, 128, 256 or 1024) is reached. The bias condition used in "erase verify", e.g., $V_G$=0 V and $V_C$=+1.2 V, as compared to that used in a read operation, e.g., $V_G$=+5 V and $V_C$=+1.2 V, uses a lower $V_G$ to ensure, with a comfortable margin, that the erase bits are in the low $V_t$ state.

According to one aspect of the present invention, the flash memory of the present invention can be used with any type of NOR-plane array flash memory using a Fowler-Nordheim tunneling mechanism. In FIG. 5, a typical array architecture for the memory array 52 of FIG. 3 is depicted. The memory array architecture shown in FIG. 5 is a NOR-type flash memory array having word lines 60, select lines 66, source lines 67, main bit lines 70 and sub-bit lines 75. Note that the source lines 67 in the NOR-flash architecture of FIG. 5 are parallel to the word lines 60. Although FIG. 5 depicts 4 columns of floating gate transistors (i.e., Bit 0, Bit 1, Bit 2 and Bit 3) and several rows of word lines 60 and select lines 66, those skilled in the art will recognize that a flash memory array typically contain a much a larger number of columns and rows.

Figure 6:
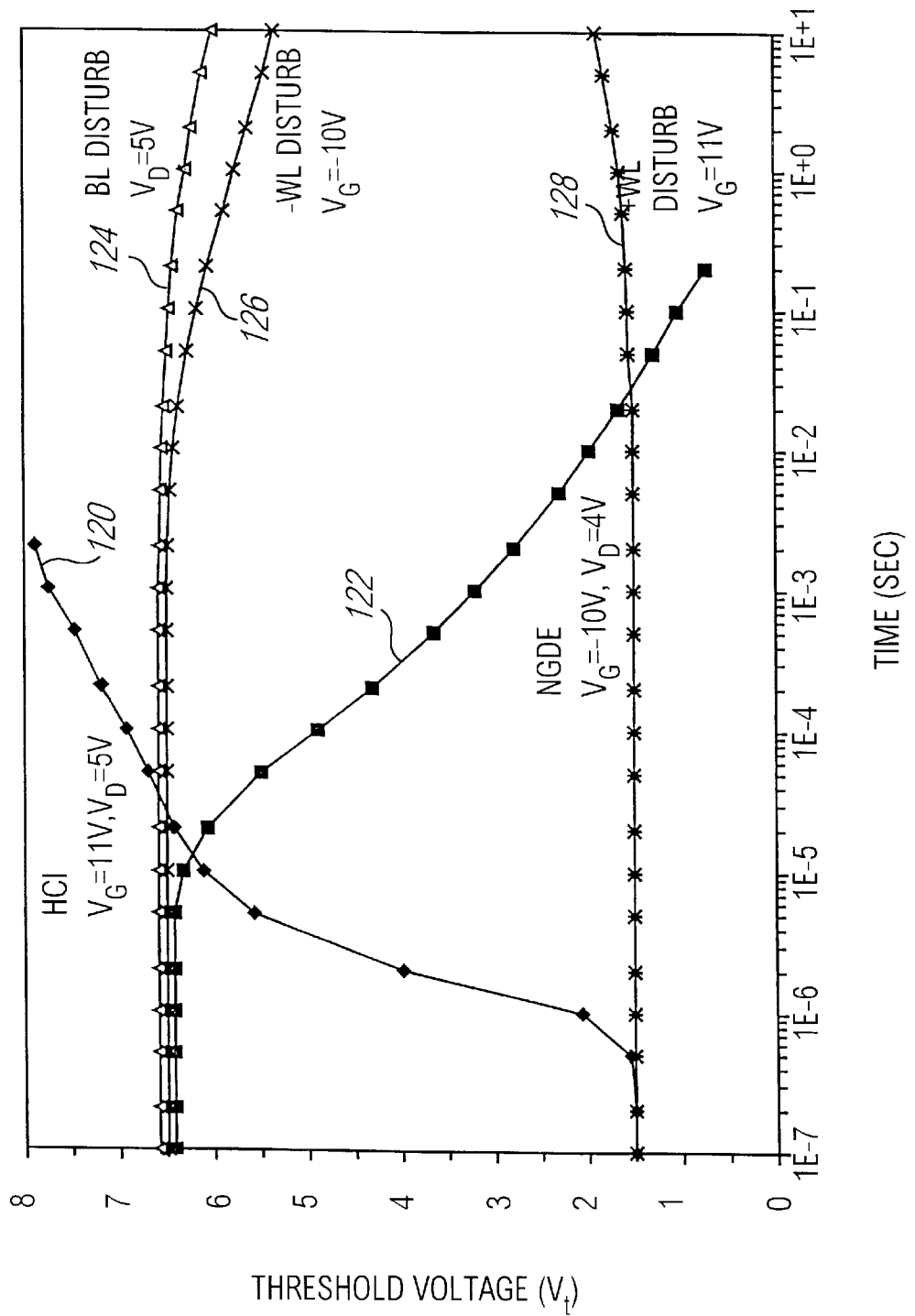
FIG. 6 is a graph showing threshold voltage as a function of time during program/erase operations of a flash memory of the present invention.

In FIG. 6, the threshold voltages ($V_t$) of a flash memory cell during program and erase operations are plotted against the time. The disturb $V_t$ data were recorded at a high temperature of 85° C. for the worst-case scenario. The maximum allowable $V_t$ shift was assumed to be 0.8 V for both programmed and erased state.

As shown in FIG. 6, the threshold voltage 120 due to HCI programming (at $V_G$=+11 V and $V_D$=+5 V) increases with time, while the threshold voltage 122 during a NGDE erase operation (at $V_G$=−10 V and $V_D$=+4 V) decreases with time. Also shown in FIG. 6 are the threshold voltage changes for three different disturb characteristics 124, 126 and 128. The first disturb characteristic 124, which remains fairly constant over time, is the bit line disturb having a drain voltage of +5 V. The second disturb characteristic 126, which also remains fairly constant over time except for t≧0.1 sec, is the negative word line disturbance having a control gate voltage of −10 V. The third disturb characteristic 128, which is also almost constant over time, is the positive word line disturb having a control gate voltage of +11 V.

The typical program time and erase time of the flash memory cell in FIG. 6 are 10 μsec and 50 msec, respectively. To cause a $V_t$ shift of 0.8 V, the −WL disturb time is empirically determined to be approximately 5.0 sec whereas the +WL disturb time is approximately 50 sec. Thus, the −WL counter limit can be set at 100 (5 sec/50 msec=100). Likewise, the +WL counter limit can be set at $10^6$ (50 sec/10 μsec=5×$10^6$). Apparently, the +WL disturb is of much less a concern than the −WL disturb.

The bit line disturb time is empirically determined to be approximately 100 sec for the bit line voltage ($V_{BL}$=$V_D$) of +5 V. As a result, the BLp counter limit can be set at $10^7$ (100 sec/10 μsec=$10^7$). On the other hand, the bit line disturb time for the bit line voltage of +4 V is approximately 1000 sec, so that the BLe counter limit can be set at 20,000 (1000 sec/50 msec=20,000).

In summary, the −WL disturb count limit is equal to 100 erase cycles, the +WL disturb count limit is equal to 5×$10^6$ program cycles, and the BLp disturb is equal to $10^7$ program cycles. Hence, for a flash memory having a lifetime of 1 million cycles, it is important to handle properly the −WL disturb control. As a consequence, it is preferable for the flash memory system of the present invention to have a −WL counter for every word line, and the counter limit for each −WL counter is preferably set at 100.

The following is a sample implementation of the biasing voltages used in the programming, erasing, and reading of a flash memory block of the present invention on the same chip. Negative voltages are used on the erase operation only.

TABLE 1

| OPERATION | WL VOLTAGE ($V_G$) | BL VOLTAGE ($V_D$) | SL VOLTAGE ($V_S$) |
|---|---|---|---|
| Program | | | |
| Selected Cells | +11 V | +5 V | 0 V |
| Unselected Cells on the same WL | +11 V | 0 V | 0 V |
| Unselected Cells on the same BL | 0 V | +5 V | 0 V |
| Erase | | | |
| Selected Cells | −10 V | +4 V | floating |
| Unselected Cells on the same WL | −10 V | 0 V | floating |
| Unselected Cells on the same BL | 0 V | +4 V | floating |
| Read | | | |
| Selected Cells | +5 V | +1.2 V | 0 V |
| Unselected Cells on the same WL | +5 V | 0 V | 0 V |
| Unselected Cells on the same BL | 0 V | +1.2 V | 0 V |

Figure 7:
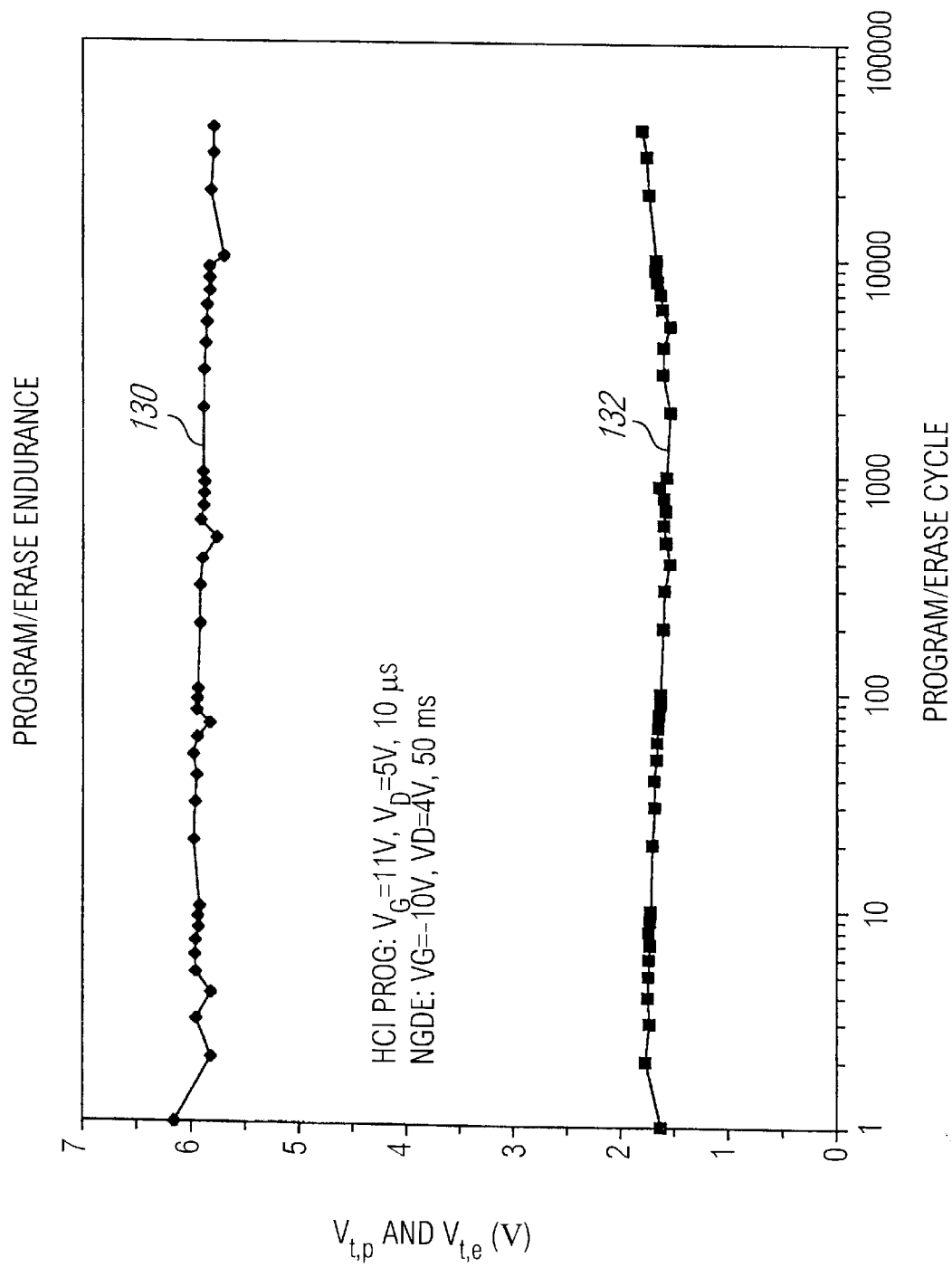
FIG. 7 is a graph showing the program/erase endurance of a flash memory of the present invention as a function of program/erase cycles.

FIG. 7 shows the $V_t$ window closure versus program/erase cycles. The $V_t$ window closure is caused by electrons trapped in the tunnel oxide that reduce the amount of charges transferred to the floating gate. A quickly developed window closure means the endurance is poor. In FIG. 7, the after-program and after-erase cell threshold voltages of a flash memory cell of the present invention ($V_{t,p}$ and $V_{t,e}$, respectively) are plotted against the number of program or erase cycles. Both the $V_{t,p}$ curve 130 and $V_{t,e}$ curve 132 show little change up to 40,000 program/erase cycles, signifying great program/erase endurance. Such excellent endurance data also indicate that hot carrier injection programming and NGDE erase are feasible for the flash memory of the present invention.

The flash memory of the present invention, while surpassing prior art in terms of endurance and disturb control, is simple to construct and inexpensive to manufacture. Thus, the present invention allows a convenient program operation in which data in bytes, rather than in the form of whole sector or page, can be reprogrammed without having to be erased first. Moreover, by allowing either "1" or "0" to be written to a bit without disturb, instead of having to first write "0" to any bit, the present invention provides flash memory cell that operates in a fashion similar to a DRAM or SRAM, yet having the advantage of being a nonvolatile memory.

While the present invention has been particularly shown and described with reference to the above preferred embodiments, it is to be understood by those skilled in the art that many other modifications and variations may be made thereto without departing from the broader spirit and scope of the invention as set forth in the claims. The disclosed array structure, architecture and method are not limited to flash memory arrays, but may also used in other types of memory devices having similar features. The specification and drawings are accordingly to be regarded as being illustrative, rather than being restrictive.

What is claimed is:

1. A flash memory system for program and erase operations in a pre-selected number of bits, comprising:
   a memory array including a plurality of memory cells sharing in common a plurality of word lines and a plurality of bit lines;

means for programming one of said memory cells by using the hot carrier injection mechanism, said memory cell selected by choosing one of said word lines and one of said bit lines of said memory array;

means for erasing one of said memory cells by using the Fowler-Nordheim tunneling mechanism, said memory cell selected by choosing one of said word lines and one of said bit lines of said memory array;

means for counting the numbers of said program and erase operations occurring in said memory cells, said counting means having pre-determined limits, said counting means coupled to at least one of said programming means, said erasing means and said reading means; and means for temporarily storing information transferred from said memory array while said memory array is refreshed.

2. The flash memory system of claim 1, wherein said storing means is an on-chip memory device.

3. The flash memory system of claim 1, wherein said storing means is an off-chip memory device.

4. A flash memory system for program and erase operations in a pre-selected number of bits, comprising:

a memory array including a plurality of memory cells sharing in common a plurality of word lines and a plurality of bit lines, each said memory cell having a source, a drain and a control gate;

means for programming one of said memory cells by applying a first positive voltage to the control gate of said memory cell and a second positive voltage to the drain of said memory cell while grounding the source of said memory cell, said memory cell selected by choosing one of said word lines and one of said bit lines of said memory array;

means for erasing one of said memory cells by applying a negative voltage to the control gate of said memory cell and a third positive voltage to the drain of said memory cell while allowing the source of said memory cell to float, said memory cell selected by choosing one of said word lines and one of said bit lines of said memory array;

means for reading one of said memory cells by applying a fourth positive voltage to the control gate of said memory cell and a fifth positive voltage to the drain of said memory cell while grounding the source of said memory cell, said memory cell selected by choosing one of said word lines and one of said bit lines of said memory array;

means for counting the numbers of said program and erase operations occurring in each of said memory cells, said counting means coupled to at least one of said programming means, said erasing means and said reading means; and means for temporarily storing information transferred from said memory array while said memory array is refreshed.

5. The flash memory system of claim 4, wherein said storing means is an on-chip memory device.

6. The flash memory system of claim 4, wherein said storing means is an off-chip memory device.

7. The flash memory system of claim 4, wherein said counting means comprises one or more word line disturb counters and one or more bit line disturb counters.

8. A method for programming, erasing and refreshing a flash memory array including a secondary memory device, a plurality of counter assemblies each having a first pre-determined limit for program cycles and a second pre-determined limit for erase cycles, and a plurality of flash memory cells each having a source, a drain and a control gate and each coupled to one of said counter assemblies, said method comprising the steps of:

programming said memory array by applying a first positive voltage to the control gate of one of said memory cell and a second positive voltage to the drain of said memory cell while grounding the source of said memory cell;

erasing said memory array by applying a negative voltage to the control gate of one of said memory cell and a third positive voltage to the drain of said memory cell while allowing the source of said memory cell to float;

recording the number of program cycles and the number of erase cycles in the counter assembly coupled to said memory cell and comparing said number of program cycles with said first pre-determined limit of said counter assembly and said number of erase cycles with said second pre-determined limit of said counter assembly; and refreshing said memory by transferring data stored in said memory array to said secondary memory device when either said number of program cycles reaches said first pre-determined limit or said number of erase cycles reaches said second pre-determined limit, resetting set number of program cycles and said number of erase cycles in said counter assembly to zero, and restoring said data from said secondary memory device to said memory array.

9. The method of claim 8, further comprising the step of:

after transferring data stored in said memory array to said secondary memory device and before restoring said data from said second memory device to said memory array, performing programming verification on said memory array.

10. The method of claim 8, further comprising the step of:

after transferring data stored in said memory array to said secondary memory device and before restoring said data from said second memory device to said memory array, performing erase verification on said memory array.

11. The method of claim 8, wherein said second pre-determined limit is approximately 100.

* * * * *